(12) United States Patent
Harron et al.

(10) Patent No.: US 7,084,676 B2
(45) Date of Patent: Aug. 1, 2006

(54) METHOD AND APPARATUS FOR FRACTIONAL RF SIGNAL SYNTHESIS

(75) Inventors: Gerald Harron, Martensville (CA); Surinder Kumar, Victoria (CA)

(73) Assignee: VCom Inc., Victoria (CA)

(*) Notice: Subject to any disclaimer, the term of this patent is extended or adjusted under 35 U.S.C. 154(b) by 21 days.

(21) Appl. No.: 10/796,417

(22) Filed: Mar. 10, 2004

(65) Prior Publication Data

US 2005/0083085 A1   Apr. 21, 2005

Related U.S. Application Data

(60) Provisional application No. 60/511,677, filed on Oct. 17, 2003.

(51) Int. Cl.
    *H03B 19/00* (2006.01)
(52) U.S. Cl. .................. 327/105; 327/107; 327/355; 708/270
(58) Field of Classification Search ............. 327/105, 327/107, 355, 361; 708/270, 271
    See application file for complete search history.

(56) References Cited

U.S. PATENT DOCUMENTS

| 5,610,950 | A | * | 3/1997 | Duch ..................... 375/350 |
| 5,671,227 | A | * | 9/1997 | Keller et al. ............ 370/509 |
| 5,686,864 | A | * | 11/1997 | Martin et al. ........... 331/1 A |
| 5,905,388 | A | * | 5/1999 | Van Der Valk et al. ... 327/107 |
| 6,262,604 | B1 | * | 7/2001 | Gabet et al. ............. 327/107 |
| 6,693,468 | B1 | * | 2/2004 | Humphreys et al. ..... 327/105 |

* cited by examiner

*Primary Examiner*—Timothy P. Callahan
*Assistant Examiner*—An T. Luu
(74) *Attorney, Agent, or Firm*—Adrian D. Battison; Michael R. Williams; Ryan W. Dupuis

(57) ABSTRACT

The present invention provides a method to improve the frequency resolution and phase noise of a synthesized RF signal. It also results in the superior characteristics of instantaneous frequency changeability, wide frequency setting ability, and fully digital ASIC implementation ability. The synthesized RF signal is generated from a higher reference frequency using a variable pulse stretching technique. The amount of the pulse stretch in each cycle is controlled by a phase increment value and is implemented using programmable delay lines. Pulse stretching is extended beyond one cycle by pulse swallowing, allowing the generation of an RF signal from DC up to the input reference clock signal frequency.

23 Claims, 6 Drawing Sheets

METHOD AND APPARATUS FOR FRACTIONAL RF SIGNAL SYNTHESIS

This application claims priority under 35 U.S.C. 119 from Provisional Application Ser. No. 60/511,677 filed Oct. 17, 2003.

This invention relates generally to telecommunication systems. The present invention relates more specifically to a method of synthesizing an RF signal used in telecommunication systems.

This application is related to applications filed on the same day by the same inventors under application Ser. No. 10/796,416 entitled APPARATUS FOR DIGITAL VECTOR QAM MODULATOR and application Ser. No. 10/796,415 entitled APPARATUS FOR FRACTIONAL RF SIGNAL SYNTHESIS WITH PHASE MODULATION the disclosures of which are incorporated herein by reference.

BACKGROUND OF THE INVENTION

In communication systems an oscillator is used as a fundamental building block. Oscillators are commonly used for up and down frequency conversion. They are also required for subsystems such as a direct modulator. The quality of a fixed frequency oscillator is measured by the frequency accuracy and the phase noise performance. In communication systems, the basic RF oscillator is used in conjunction with additional circuitry to stabilize the frequency of the oscillator as typical free running RF oscillators are not stable enough for most communication systems. It is well known that crystal oscillators provide a high degree of frequency accuracy and phase noise performance. Hence, it is common in prior art to lock the RF oscillator to a lower frequency crystal oscillator in order to achieve the desired frequency stability. Besides frequency stability, other qualities including the ability to tune a single oscillator over a wide frequency range, the ability of having a very fine frequency resolution control, and the ability to change the frequency very rapidly are quite imperative. Numerous prior art methods exist for the generation of an oscillator subsystem with varying degrees of compromises and limitations. Commonly used methods are discussed below and are described in more detail hereinafter in conjunction with the accompanying drawings.

The first method uses frequency multiplication wherein crystal oscillators that are commonly available at low frequencies are multiplied up using frequency multiplication. This method yields a high phase noise performance but suffers from very limited frequency agility.

The second method uses a phase locked loop (PLL). PLLs are available in a variety of forms such as fixed modulus, dual modulus, and fractional N. Many integrated circuit implementations are available. However a PLL with lower loop bandwidth thus has to be used which consequently degrades the phase noise.

The third method is a digital delay lock loop (DLL). This has the advantage that the oscillator is suitable for implementation in an ASIC. A variable delay control is used in conjunction with the phase detector to lock the oscillator frequency to a multiple of the input reference frequency. This method suffers from limitations to the PLL implementation. It also faces additional problems with frequency agility as well as the jitter introduced by the delay lock loop because of mismatched delays.

The fourth method is known as direct digital synthesis (DDS). This method results in very fine frequency resolution, but produces undesired spurious signals and the output signal frequency is limited by the speed of the DAC. The signal frequency for the DDS is limited to Nyquist frequency which is half of the clock frequency to the DAC. Output signal level drops as the Nyquist frequency is approached.

A fifth method is through phase interpolation as described in U.S. Pat. No. 6,114,914 (Mar) issued Sep. 5, 2000. This method is limited in its factional capability and still uses a VCO, phase detector, and loop filter. Normal conflict between better phase noise and higher frequency resolution still exists for this method.

SUMMARY OF THE INVENTION

According to the present invention there is provided an apparatus for direct digital generation of a synthesized RF signal at a desired output frequency comprising:

a high speed reference clock providing in an input signal having a series of signal reference edges at a frequency of the reference clock which is higher than the desired output frequency;

programmable digital delay elements arranged to receive the reference edges of the input reference clock and to generate delayed signal edges each at a calculated delay from a respective reference edge;

and a signal combining element for receiving the delayed signal edges and for generating the RF signal therefrom.

Preferably the output frequency is set from an increment value according to the following equation:

$$\text{Increment Value} = ((f_{ref}/f_{out})-1)*2^n$$

where $f_{ref}$=Reference clock (103) frequency $f_{out}$=Output (110) frequency n=Number of bits in the accumulator math.

Preferably the duty cycle is set by initializing the difference of the initializing values of the two accumulators according to the following equation:

The reference clock frequency divided by the desired output frequency multiplied by $2^n$ multiplied by (p/100), where p is the percentage duty cycle and n is the number of bits in the accumulator math.

Preferably the worst case frequency resolution is determined by the equation:

The reference frequency divided by $2^n$, where n is equal to the number of bits in the accumulator.

Preferably the duty cycle of the output can be varied by changing the difference in the start values of the accumulators for the rising and falling edge delay control.

Preferably phase delay of the programmable delay is calibrated from the phase accumulator value using a look up table or Microprocessor.

Preferably separate delay controls are used for producing the rising and falling edges of the output from the same input edge of the reference clock.

Preferably the reference edge of the reference clock is delayed by the programmable delay lines.

Preferably the reference edge may be either the rising or falling edge of the reference clock.

Preferably the carry bits (overflow bits) are used to control a pulse swallowing circuit to extend the delay to multi cycles of the input reference clock.

Preferably the clock swallow circuit can ignore/block multiple reference clock pulses thus giving the delay line endless delay capability.

Preferably the clock swallow circuit can be located prior to or following the programmable delay line.

Preferably a set reset flipflop is used to combine the separate rising and falling edge delays to form any desired duty cycle output.

Preferably the output duty cycle is not dependent on the input duty cycle.

Preferably increasing the number of bits in the adder math increases the frequency resolution with negligible degradation in the phase noise performance.

Preferably the number of bits of math used in the adder is equal to or greater than the number of bits of control in the lookup table and/or the programmable delay.

Preferably the speed is increased using parallel processing in the adders, and/or accumulators.

Preferably the adders/accumulators is implemented in a larger lookup table wherein all the answers of the pattern are precomputed and stored.

Preferably an optional arrangement could include plurality of adders, accumulators, pulse swallow circuits, lookup tables, and programmable delay lines.

Preferably the lookup table has a multiple set of lookup tables to be used for temperature compensation of the programmable delay line.

Preferably the implementation is done fully digitally in an ASIC with no requirement for a voltage controlled oscillator, loop filter, or Digital to Analog converter used in prior art solutions.

Preferably an optional arrangement could include amplification and filtering of the output to produce a signal that is higher in amplitude and/or having less harmonics.

It is an object of the present invention to provide an RF signal that has superior phase noise and frequency resolution with the additional benefits of instantaneous frequency change capability, wide frequency range ability, and suitability for digital ASIC implementation with no external components.

The present invention is based on digital generation of an RF signal from a higher frequency reference signal using pulse stretching to delay each edge of the reference clock to the desired time instant. In the proposed method, provision is made to swallow a clock edge when required thereby allowing the synthesis of any desired lower frequency from DC to the reference input frequency.

Table 1 is a Sample timing calculations for Invention.

DETAILED DESCRIPTION

Figure 1:
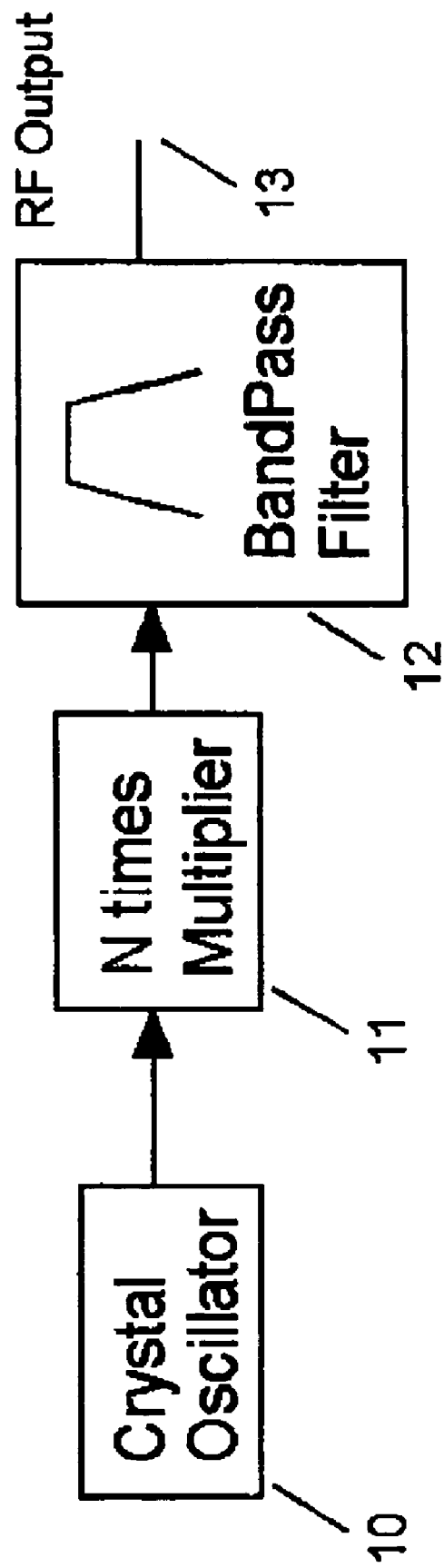
FIG. 1 is a block diagram of a Prior Art Frequency Multiplier.

FIG. 1 illustrates the first method mentioned above where a crystal oscillator 10 is subjected to a nonlinearity in order to realize a frequency multiplier 11. The desired multiplied frequency is filtered using a band pass filter 12, resulting in the RF output frequency 13. This method yields a high phase noise performance but suffers from very limited frequency agility.

Figure 2:
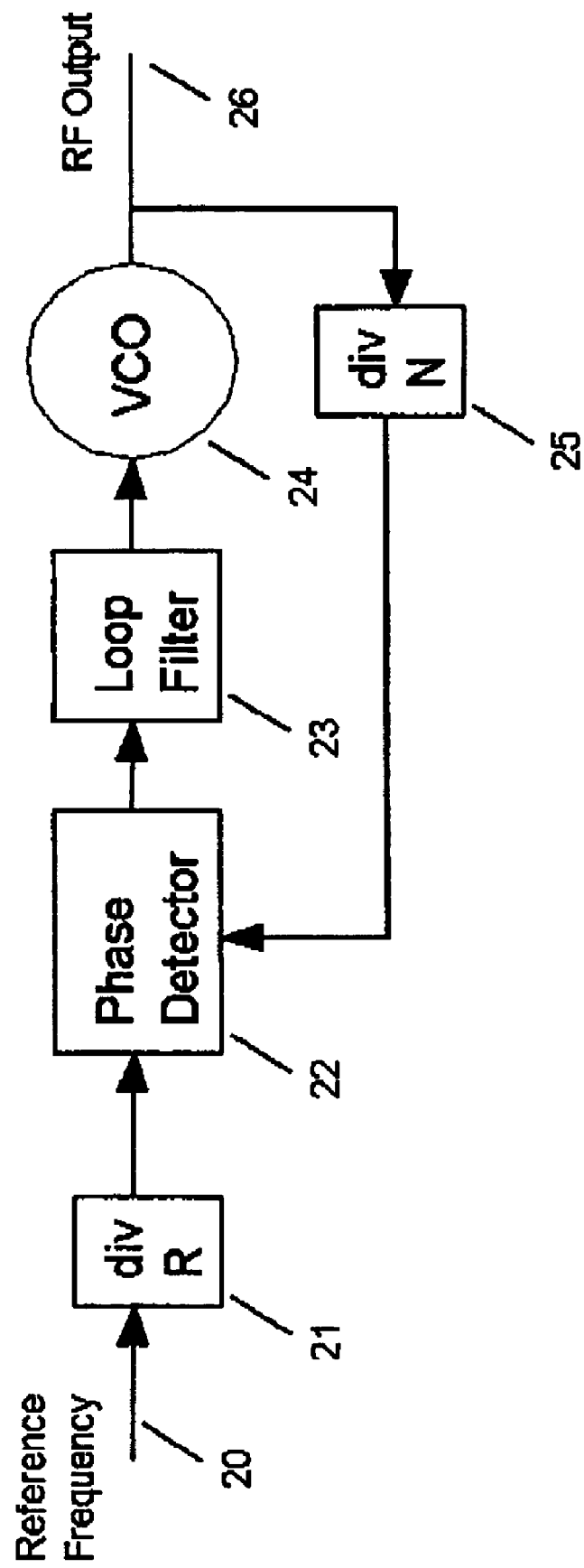
FIG. 2 is a block diagram of a Prior Art Phase Locked Loop (PLL).

The basic principal of a PLL as mentioned in the second method above is shown in FIG. 2. As illustrated in the figure, a stable reference frequency 20 is divided down 21. The output RF signal frequency 26 is also divided down 25. The two divided frequency signals are then fed to the phase detector 22 for phase comparison. The phase detector 22 is used to produce an error signal that is filtered 23 with the required loop bandwidth to lock the RF oscillator 24 frequency to the reference frequency 20. The phase noise performance of the free running oscillator is worse than the reference crystal oscillator input 20; so the design objective is to set the loop bandwidth as wide as possible to track out as much close in phase noise as possible. Further out phase noise, outside the loop bandwidth, is limited by the oscillator phase noise characteristic. However, there is a compromise well understood by people skilled in the art. This compromise results from the fact that smaller frequency step size (higher resolution) requires division to a lower common phase detector frequency. A PLL with lower loop bandwidth thus has to be used which consequently degrades the phase noise.

Figure 3:
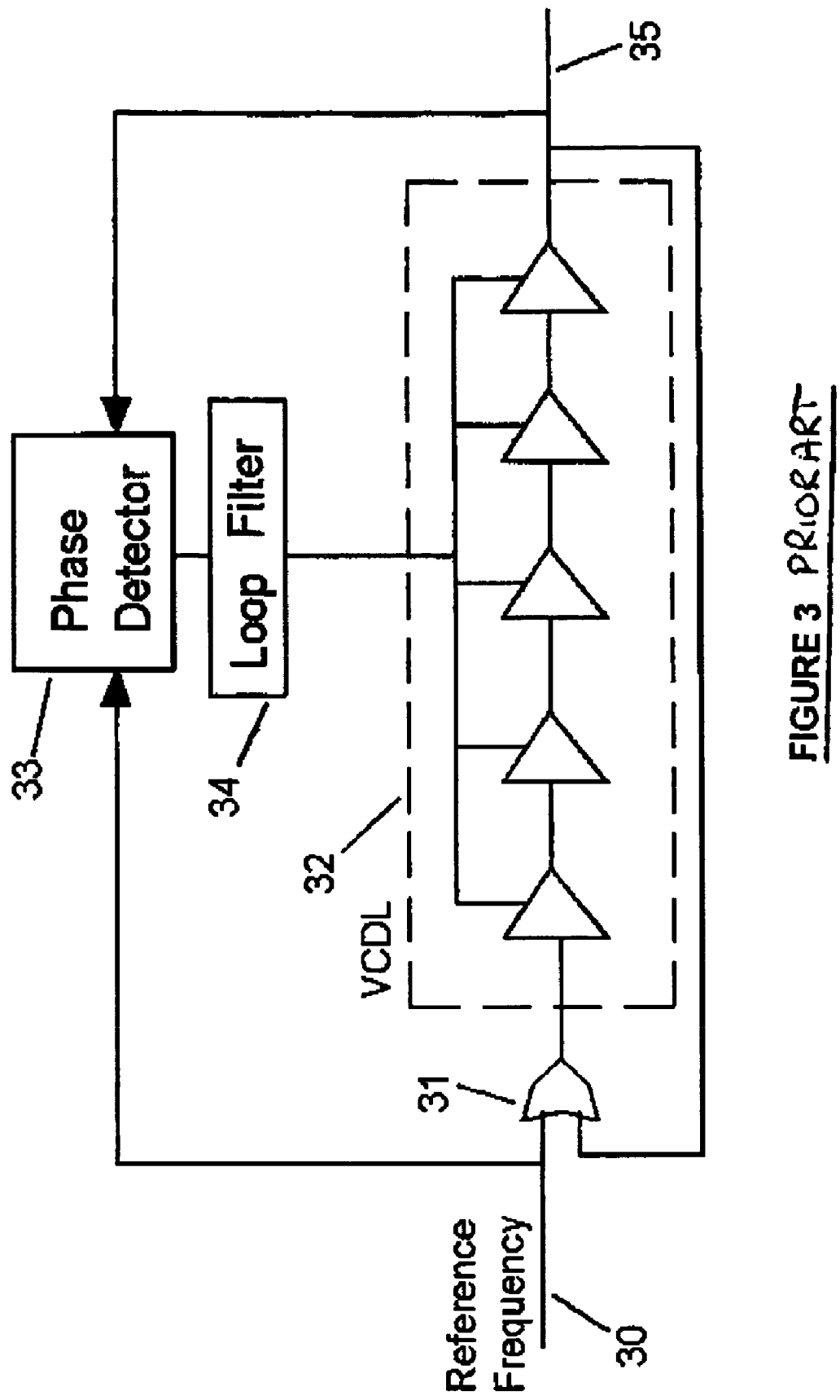
FIG. 3 is a block diagram of a Prior Art Digital Delay Locked Loop (DLL).

FIG. 3 shows a typical implementation of the third method. The reference input 30, starts a pulse traveling down a voltage controlled delay line (VCDL) 32. The pulse is returned to the input 31 and travels down the delay line again. In this way the number of pulses required to match the desired frequency multiplication are produced. The last pulse from the output 35 is phase locked to the next input reference 30 pulse using the phase detector 33 and the loop filter 34. This method suffers from limitations to the PLL implementation. It also faces additional problems with frequency agility as well as the jitter introduced by the delay lock loop because of mismatched delays.

Figure 4:
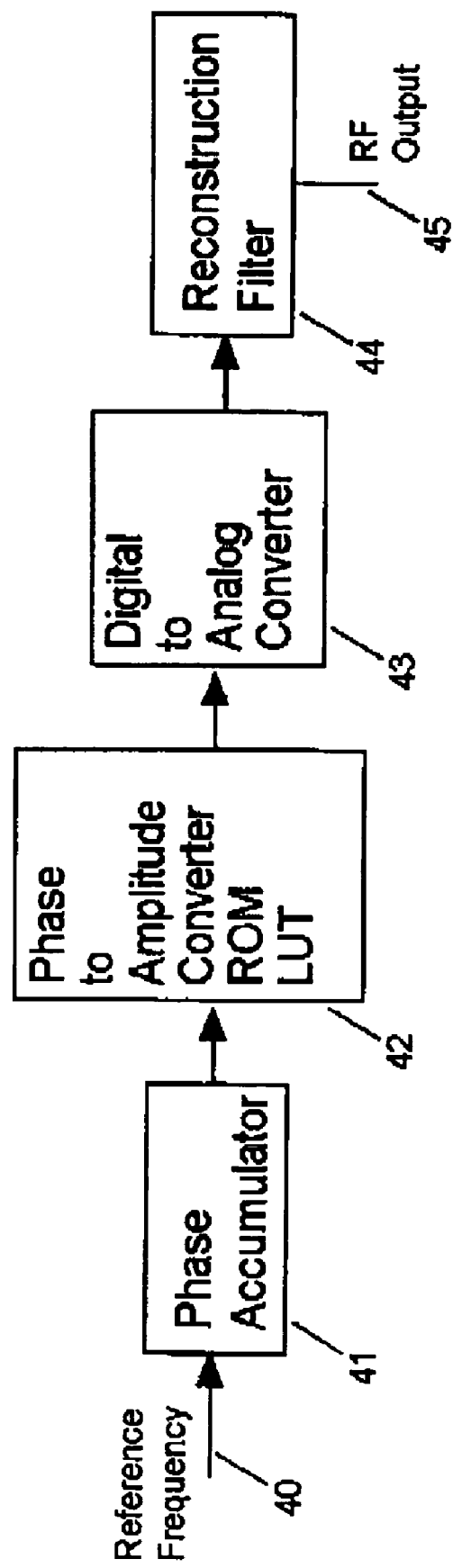
FIG. 4 is a block diagram of a Prior Art Direct Digital Synthesis (DDS).

FIG. 4 shows the basic concept of the fourth method mentioned above which is known as direct digital synthesis (DDS). As shown in the figure, the clock reference input 40 is sent to a phase accumulator 41. The required phase shift is realized by using a phase to amplitude converter 42 Read only Memory (ROM) look up table. A Digital to Analog Converter (DAC) 43 is used to reconstruct the signal. External filtering 44 is used to filter off the clock and aliasing components from the DAC output thereby resulting in the desired RF signal 45. This method results in very fine frequency resolution, but produces undesired spurious signals and the output signal frequency is limited by the speed of the DAC. The signal frequency for the DDS is limited to Nyquist frequency which is half of the clock frequency to the DAC. Output signal level drops as the Nyquist frequency is approached.

Figure 5:
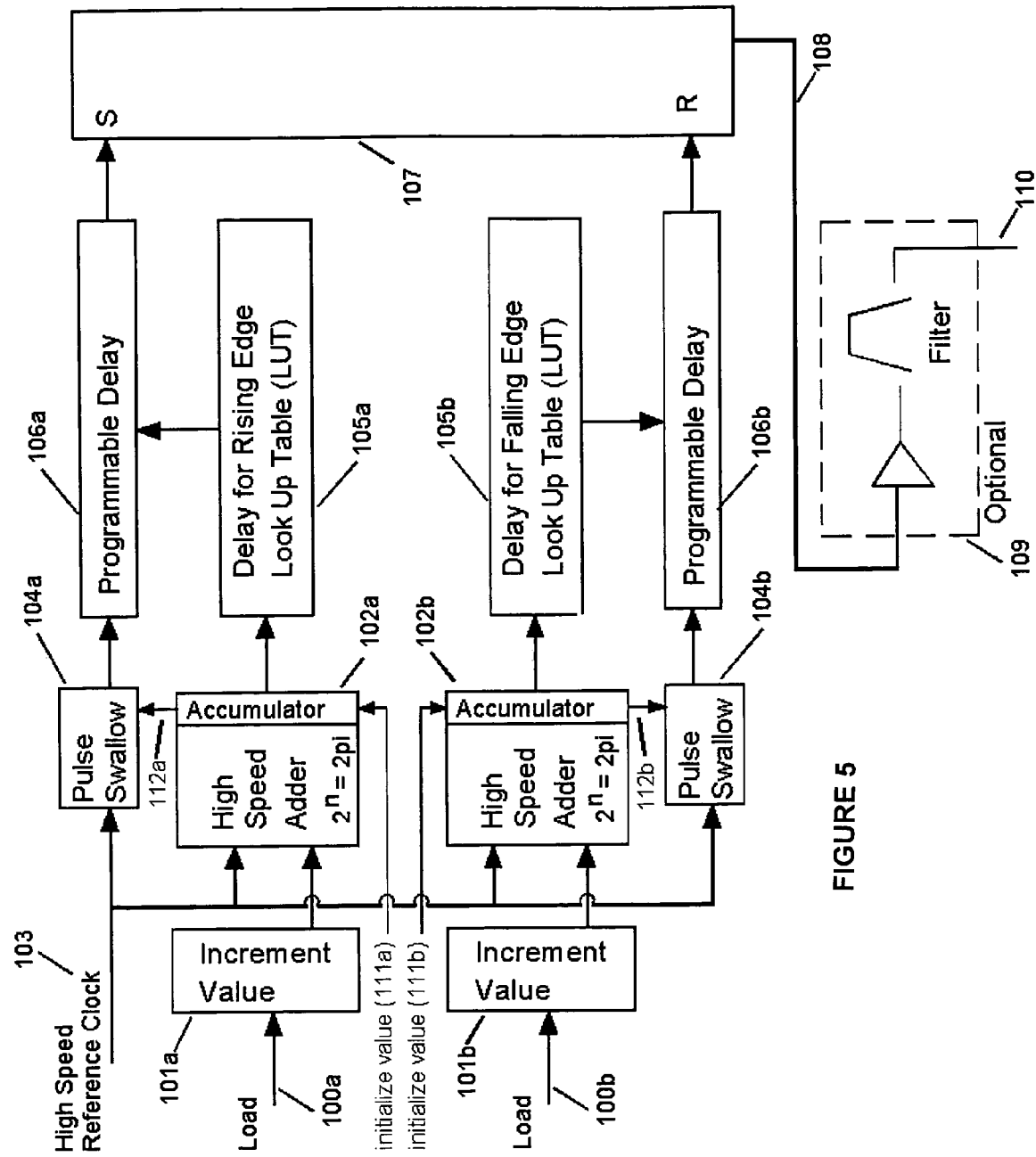
FIG. 5. is a block diagram of a System for RF signal synthesis.

FIG. 5 shows a block diagram of one embodiment of the invention. This arrangement synthesizes a desired lower frequency with high resolution from a fixed frequency high speed reference clock. This is accomplished fully digitally in an ASIC without the use of a VCO, loop filter, or DAC. The high speed reference clock 103 is typically an external input with high frequency absolute accuracy and very low phase noise. Examples of sources are well known in the art and include high frequency crystal oscillators, SAW oscillators, and crystal oscillators with harmonic multiplication. As shown in FIG. 5, an edge of the reference clock is delayed by an amount that is controlled by the Accumulator 102 along with a lookup table and programmable delay 106. The edge could be either the rising or falling edge of the reference clock. Separate circuits are used for the control of rising and falling edges of the output signal 108 from the same input edge of the reference clock. This ensures that even if the duty cycle of the input reference is not 50%, the output 108 duty cycle can be controlled as both the rising edge and falling edge delay is triggered from the same edge of the reference clock 103. The desired output duty cycle is typically 50% to maximize the RF power in the fundamental frequency. However, any desired duty cycle of the output signal can be produced for special applications. The output signal 110 frequency is selected by setting the increment value. Typically, the two increment values 101a and 101b are set to be the same. The required increment value 101 is computed by using the following equation:

$$\text{Increment Value} = ((f_{ref}/f_{out}) - 1) * 2^n$$

where $f_{ref}$=Reference clock 103 frequency
$f_{out}$=Output 110 frequency
n=Number of bits in the accumulator math.

Table 1 shows sample calculations for an example where the high speed reference clock 103 is 1000 MHz, and the desired output RF frequency is 734.313739 MHz and n=12. Using these numbers in the frequency setting equation yields an increment value 101 of 1482. This increment value is added each high speed reference clock 103 cycle to the accumulator to produce a new accumulator value.

The second equation controls the duty cycle of the output. As shown in FIG. 5, there are separate blocks to control the rising edge delay (a) and the falling edge delay (b). To accomplish a fixed duty cycle, the increment values 101a and 101b must be the same and the initial start up values 111a and 111b in the accumulator must be set to provide for the desired fixed delay between them. The equation for the initializing value 111b assuming the initializing value for 111a to be zero is as follows:

$$\text{Initializing Value (111b assuming 111a is 0)} = (f_{ref}/f_{out}) * 2^n * (p/100)$$

where $f_{ref}$=Reference clock (103) frequency
$f_{out}$=Output (110) frequency
n=Number of bits in the accumulator math
p=Percentage duty cycle.

For the example shown in Table 1, for duty cycle p=50%, the initializing value 111b is calculated to be 2789. Table 1 illustrates that the adder/accumulator 102a starts at 0 and increments 1482 at every rising edge of the reference clock. At the same time adder/accumulator 102b starts at 2789 and increments 1482 every rising edge of the reference edge. When the adder/accumulator 102 overflows and produces a carry out due to the math addition, an input pulse edge must be ignored or "swallowed". This corresponds to phase wraparound, i.e. the phase shift has reached 360 degrees and must be set to 0 degrees. In the present invention, $2^n$ is calibrated to equal 360 degrees of the reference clock input 103. This calibration is performed in the LUT 105 by a simple mapping of input control bits to desired control lines. The filling of the LUT 105 to perform this requirement would be well understood by those skilled in the art. The LUTs 105 can be implemented using a read only memory or with a microprocessor. The adder/accumulator overflows due to an addition indicates a greater than 360 degree delay requirement. This delay is implemented by using the next clock edge rather than delaying from the original clock edge. This allows the programmable delay line 106 to act as a delay line with endless delay capability. For example if the accumulator is using 12 bit math then 360 degrees is equal to $2^{12}$ or 4096. In the example shown in Table 1, the accumulator overflows to 4446, which means the overflow bits are set to a value of 1 and accumulator value goes to 4446–4096=350. The circuit implements the requirement for this value of phase delay in two parts. It activates the pulse swallow circuit 104 to ignore one clock edge, and sets the programmable delay to 350 which completes the rest of the delay requirement. This unique feature of the present invention means that any quantity of overflow bits could be handled. If the addition of the increment value 101 to the accumulator value 102 causes, for example, two overflow bits, then the pulse swallow circuit 104 would ignore or "swallow" 2 pulses. In this way it is possible to synthesis very low frequencies 108 from the high speed clock reference 103. The delay required to achieve this is limited to one cycle at the high speed reference clock rate. Furthermore, the accuracy of the timing and jitter is excellent, as the time is always relative to the closest edge of the high speed clock reference 103. The output signal phase noise is not controlled by the loop bandwidth nor the phase noise characteristics of the voltage controlled oscillators applied in traditional methods. Instead, the phase noise performance is directly linked to the high speed reference. This reduces both the jitter and phase noise of the synthesized RF output 108. The delayed edge from the programmable delay 106a sets the output RF high 108 by enabling a set-reset flipflop 107. When the delayed edge from the programmable delay 106b reaches the flipflop, it resets the flip flop 107 and causes the RF output 108 to go low. This completes the synthesis of the RF output 108 at the preferred 50% duty cycle rate.

Figure 6:
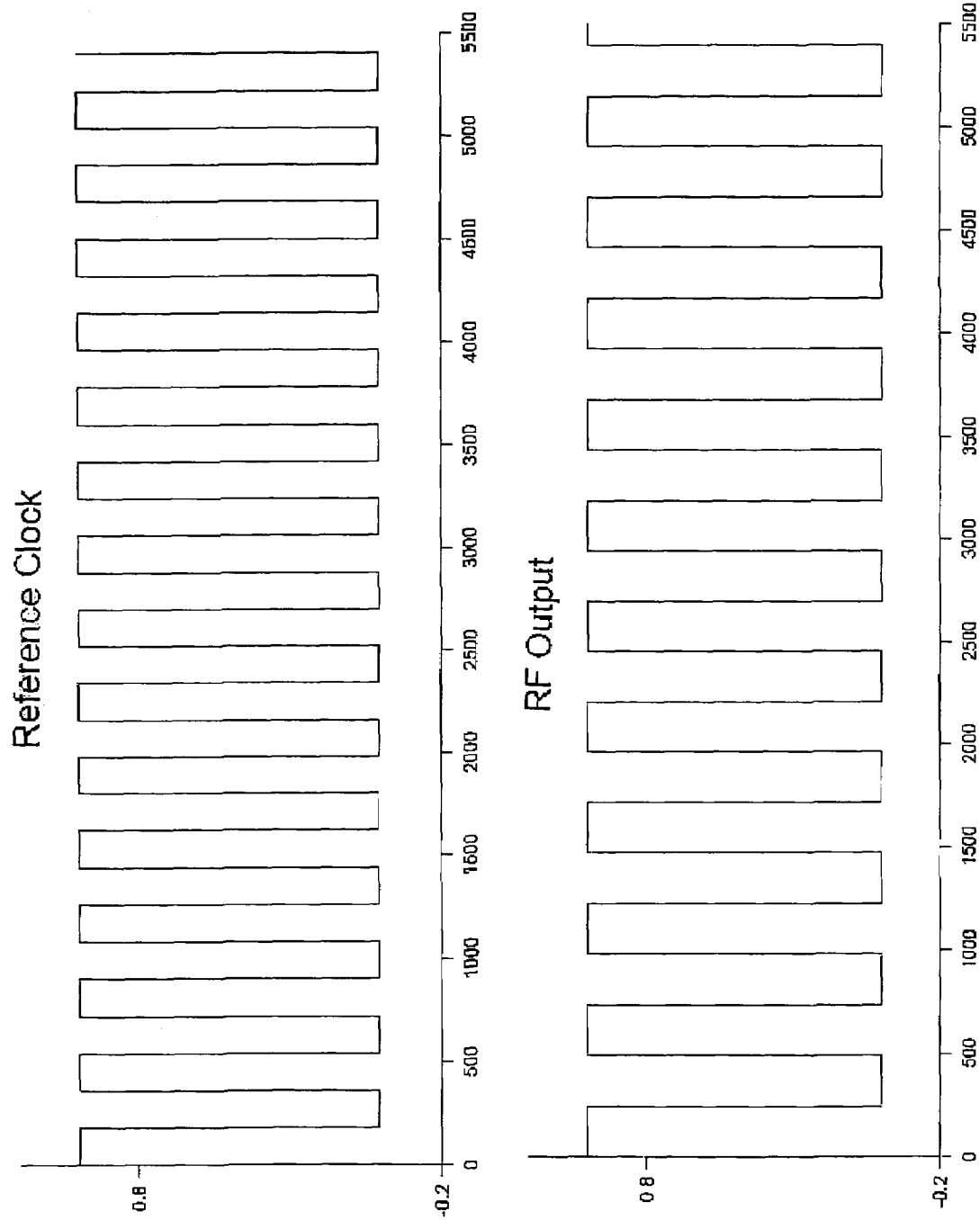
FIG. 6 is a Timing diagram for Sample shown in Table 1.

FIG. 6 illustrates time plots for the example in Table 1. The upper plot is the high speed reference clock plotted over 5500 degrees. The lower plot is the RF output 108, plotted over that same 5500 degrees of phase shift with respect to the reference clock. The lower plot demonstrated the synthesis of a lower frequency from the high speed reference clock. Optionally the output 108 can be amplified and or filtered to produce a signal that is higher in amplitude and/or having less harmonics.

The frequency step size of this invention depends on the frequency and the number of bits n in the accumulator math. It is coarser at frequencies closer to the reference clock frequency, and finer at lower frequency outputs. The worst case step size is the reference frequency divided by $2^n$, where n is equal to the number of bits in the accumulator math. In the example of Table 1, the step size is 1000 MHz divided by $2^n$. This gives a step size of approximately 244 KHz. To improve the frequency resolution an increased number of bits in the math can be used. For example with 16 bit math, the frequency resolution improves to approximately 15.2 KHz. Increasing n to 32 bits would result in approximately 0.2 Hz frequency resolution. It is only necessary to increase the number of bits of resolution in the adder/accumulators 102, and not necessarily the LUTs 105 and the programmable dividers 106. In essence the number of bits of math used in the adder should be equal to or exceed the number of bits of control in the lookup table and/or programmable delay. The remaining least significant bits can be truncated before the LUTs 105 with negligible effect on the RF output 108 phase noise quality. This means that very fine frequency resolution is achieved with negligible degradation in the phase noise. It can also be seen that the increment values 101 can be changed to provide an essentially instantaneous frequency change. Another aspect of the invention is that the output frequency 108 synthesis range is very wide. The pulse swallow 104 circuit can block multiple reference clock pulses extending the programmable delay indefinitely. The limitation comes from the number of overflow bits allowed in the accumulator. The output frequency range coverage can be DC up to the high speed reference clock frequency. It is desirable to have as high a reference clock frequency as possible for. A higher reference clock frequency extends the useful frequency range and improves the frequency resolution. The upper reference frequency limit of the design is mostly limited by the design speeds of the high speed adders/accumulator 102 and look up tables 105. It understood in the art that speeds can be increased by parallel processing and other design techniques. For example, multiple high speed adders/accumulator, LUTs or programmable delay lines could be used in parallel to increase the speed and thereby the output frequency capability of the invention. The invention also accommodates plurality of design blocks such as adders, accumulators, pulses swallow circuits, lookup tables, and programmable delay lines.

In an alternative arrangement of the invention it is also possible to implement the invention on every 180 degrees of the reference clock using both the rising and the falling edges. Another alternative arrangement is to position the clock swallow circuit following the programmable delay line.

In an alternative arrangement of the invention it is also possible to remove the adder/accumulators 102 and replace the LUT 105 with a larger LUT 105. A simple counter could increment the values in the LUT 105. The LUT 105 would in this case hold the pre-added values, and just cycle through them until the pattern repeats.

In an alternative arrangement of the invention it is also possible to compromise latency for the speed of the device. It does not matter how many clock cycles it takes to implement an adder or LUT for example, as long as we get valid data out every reference clock cycle.

It is possible to use a selection of different lookup tables 105 or offset values to compensate for the temperature effect on the programmable delay lines 106. It is also possible to vary the implementation of the delay lines by altering the input clock signal. Examples of clock alteration would include frequency multiplication, division, or phase shifting.

Reference Clock Frequency 1000 Mhz
Example synthesis of 734.3133739 Mhz, with 12 bit math/delay
Increment value=(2^12*1000 MHz/734.3133739 MHz)−2^12
Increment Value=1482
Falling Edge Accumulator Start Value=(50% of (1000 MHz/734.3133739 MHz)*2^12)=2789

| Rising Edge | | | | | Falling Edge | | | | |
|---|---|---|---|---|---|---|---|---|---|
| Accumulator | Overflow bits | Base Accumulator | Equivalent Delay from Nearest Ref Edge (deg) | Total Effective Delay (deg) | Accumulator | Overflow bits | Base Accumulator | Equivalent Delay from Nearest Ref Edge (deg) | Total Effective Delay (deg) |
| 0 | 0 | 0 | 0 | 0 | 2789 | 0 | 2789 | 245.13 | 245.13 |
| 1482 | 0 | 1482 | 130.25 | 490.25 | 4271 | 1 | 175 | 15.38 | 735.38 |
| 2964 | 0 | 2964 | 260.51 | 980.51 | 1657 | 0 | 1657 | 145.63 | 1225.63 |
| 4446 | 1 | 350 | 30.76 | 1470.76 | 3139 | 0 | 3139 | 275.89 | 1715.89 |
| 1832 | 0 | 1832 | 161.02 | 1961.02 | 4621 | 1 | 525 | 46.14 | 2206.14 |
| 3314 | 0 | 3314 | 291.27 | 2451.27 | 2007 | 0 | 2007 | 176.4 | 2696.4 |
| 4796 | 1 | 700 | 61.52 | 2941.52 | 3489 | 0 | 3489 | 306.65 | 3186.65 |
| 2182 | 0 | 2182 | 191.78 | 3431.78 | 4971 | 1 | 875 | 76.9 | 3676.9 |
| 3664 | 0 | 3664 | 322.03 | 3922.03 | 2357 | 0 | 2357 | 207.16 | 4167.16 |
| 5146 | 1 | 1050 | 92.29 | 4412.29 | 3839 | 0 | 3839 | 337.41 | 4657.41 |
| 2532 | 0 | 2532 | 222.54 | 4902.54 | 5321 | 1 | 1225 | 107.67 | 5147.67 |
| 4014 | 0 | 4014 | 352.79 | 5392.79 | 2707 | 0 | 2707 | 237.92 | 5637.92 |
| 5496 | 1 | 1400 | 123.05 | 5883.05 | 4189 | 1 | 93 | 8.17 | 6128.17 |
| 2882 | 0 | 2882 | 253.3 | 6373.3 | 1575 | 0 | 1575 | 138.43 | 6618.43 |
| 4364 | 1 | 268 | 23.55 | 6863.55 | 3057 | 0 | 3057 | 268.68 | 7108.68 |
| 1750 | 0 | 1750 | 153.81 | 7353.81 | 4539 | 1 | 443 | 38.94 | 7598.94 |
| 3232 | 0 | 3232 | 284.06 | 7844.06 | 1925 | 0 | 1925 | 169.19 | 8089.19 |
| 4714 | 1 | 618 | 54.32 | 8334.32 | 3407 | 0 | 3407 | 299.44 | 8579.44 |
| 2100 | 0 | 2100 | 184.57 | 8824.57 | 4889 | 1 | 793 | 69.7 | 9069.7 |
| 3582 | 0 | 3582 | 314.82 | 9314.82 | 2275 | 0 | 2275 | 199.95 | 9559.95 |
| 5064 | 1 | 968 | 85.08 | 9805.08 | 3757 | 0 | 3757 | 330.21 | 10050.21 |
| 2450 | 0 | 2450 | 215.33 | 10295.33 | 5239 | 1 | 1143 | 100.46 | 10540.46 |
| 3932 | 0 | 3932 | 345.59 | 10785.59 | 2625 | 0 | 2625 | 230.71 | 11030.71 |
| 5414 | 1 | 1318 | 115.84 | 11275.84 | 4107 | 1 | 11 | 0.97 | 11520.97 |
| 2800 | 0 | 2800 | 246.09 | 11766.09 | 1493 | 0 | 1493 | 131.22 | 12011.22 |
| 4282 | 1 | 186 | 16.35 | 12256.35 | 2975 | 0 | 2975 | 261.47 | 12501.47 |
| 1668 | 0 | 1668 | 146.6 | 12746.6 | 4457 | 1 | 361 | 31.73 | 12991.73 |

The invention claimed is:

1. Apparatus for direct digital generation of a synthesized RF output signal at a desired output frequency comprising:
   a high speed reference clock providing in an input signal having a series of signal reference edges at a frequency of the reference clock which is higher than the desired output frequency;
   programmable digital delay elements arranged to receive the reference edges of the input reference clock and to generate delayed signal edges each at a calculated delay from a respective reference edge;
   and a signal generating element for receiving the delayed signal edges and for generating the RF output signal therefrom;
   wherein the signal generating element is arranged to directly generate the RF output signal so as to comprise a series of pulses each having a rising edge and a falling edge; and
   wherein the signal generating element is arranged to generate the rising and a falling edges of the pulses at a digital timing determined by the delayed signal edges calculated from a respective reference edge;
   wherein the programmable digital delay elements comprise high speed adders/accumulators wherein said adders/accumulators are arranged to determine the amount of delay implemented by the delay elements on the reference edge.

2. The apparatus according to claim 1 wherein the signal generating element is arranged to generate both the separate rising and falling edges of the pulses so as to form any desired duty cycle of the RF output signal and wherein the duty cycle is set by initializing the difference of the initializing values of the two accumulators according to the following equation:

The reference clock frequency divided by the desired output frequency multiplied by $2^{\wedge n}$ multiplied by (p/100), where p is the percentage duty cycle and n is the number of bits in the accumulator math.

3. The apparatus according to claim 1 wherein the programmable digital delay elements comprise a look-up table for providing increments to be added to calculate said delay.

4. The apparatus according to claim 3 wherein the lookup table has a multiple set of lockup tables to be used for temperature compensation of the programmable delay line.

5. The apparatus according to claim 1 wherein the signal generating element is arranged to generate both the rising and a falling edges of the pulses from rising edges only of the reference edges of the input signal of the reference clock.

6. The apparatus according to claim 1 wherein the signal generating element is arranged to generate both the rising and a falling edges of the pulses from falling edges only of the reference edges of the input signal of the reference clock.

7. The apparatus according to claim 1 wherein said programmable digital delay elements have separate controls for producing the rising and falling edges of the output from the same input edge of the reference clock.

8. The apparatus according to claim 1 wherein the programmable digital delay elements are arranged to be varied by altering the input clock signal.

9. The apparatus according to claim 1 wherein in association with the high speed adders/accumulators of the programmable delay elements there is provided a pulse swallow circuit which is controlled by the carry bits (overflow bits) of the high speed adders/accumulators in order to extend the delay to multi cycles of the input reference clock.

10. The apparatus according to claim 9 wherein the pulse swallow circuit is arranged to discard multiple reference clock pulses.

11. The apparatus according to claim 9 wherein said pulse swallow circuit is located prior to or following the programmable delay element.

12. The apparatus according to claim 1 wherein the programmable digital delay elements are arranged such that 380 degrees of phase delay of the programmable delay is calibrated to $2^{\wedge n}$ of the phase accumulator value using a look up table or microprocessor.

13. The apparatus according to claim 1 wherein the signal generating element comprises a flipflop.

14. The apparatus according to claim 1 wherein the worst case frequency resolution is determined by the equation in which the reference frequency is divided by $2^{\wedge n}$, where n is equal to the number of bits in the high speed adders/accumulators.

15. The apparatus according to claim 1 wherein the high speed adders/accumulators are arranged such that increasing the number of bits in the adder math increases the frequency resolution with negligible degradation in the phase noise performance.

16. The apparatus according to claim 1 wherein the high speed adders/accumulators are arranged such that the number of bits of math used in the adder can be equal to or exceed the number of bits of control in lookup table and/or the programmable delay.

17. The apparatus according to claim 1 wherein the high speed adders/accumulators are arranged such that the speed can be increased using parallel processing in the adders, and/or accumulators.

18. The apparatus according to claim 1 wherein the output frequency is set from a delay value according to the following equation:

$$\text{Delay Value} = ((f_{ref}/f_{out})-1) * 2^n$$

where $f_{ref}$=Reference clock (103) frequency $f_{out}$=Output (110) frequency n=Number of bits in the accumulator math.

19. Apparatus for direct digital gneration of a synthesized RF output signal at a desired output frequency comprising:

a high speed reference clock providing in an input signal having a series of signal reference edges at a frequency of the reference clock which is higher than the desired output frequency;

programmable digital delay elements arranged to receive the reference edges of the input reference clock and to generate delayed signal edges each at a calculated delay from a respective reference edge;

and a signal generating element for receiving the delayed signal edges and for generating the RF output signal therefrom;

wherein the signal generating element is arranged to directly generate the RF output signal so as to comprise a series of pulses each having a rising edge and a falling edge; and wherein the signal generating element is arranged to generate the rising and a falling edges of the pulses at a digital timing determined by the delayed signal edges calculated from a respective reference edge;

wherein the signal generating element is arranged to generate both the separate rising and falling edges of the pulses so as to form any desired duty cycle of the RF output signal.

20. The apparatus according to claim 19 wherein said signal generating element is arranged to generate both the separate rising and falling edges of the pulses such that said duty cycle of the RF output signal is not dependent on an input duty cycle of the input signal.

21. The apparatus according to claim 19 wherein said duty cycle of the RF output signal can be varied by changing the difference in initialization values of the programmable digital delay elements.

22. The apparatus according to claim 21 wherein said calculated delay for the rising and falling edges are the same value.

23. Apparatus for direct digital generation of a synthesized RF output signal at a desired output frequency comprising:

a high speed reference clock providing in en input signal having a series of signal reference edges at a frequency of the reference clock which is higher than the desired output frequency;

programmable digital delay elements arranged to receive the reference edges of the input reference clock and to generate delayed signal edges each at a calculated delay from a respective reference edge;

and a signal generating element for receiving the delayed signal edges and for generating the RF output signal therefrom;

wherein the signal generating element is arranged to directly generate the RF output signal so as to comprise a series of pulses each having a rising edge and a falling edge; and wherein the signal generating element is arranged to generate the rising and a falling edges of the pulses at a digital timing determined by the delayed signal edges calculated from a respective reference edge;

wherein the programmable digital delay elements include a lookup table wherein all the answers of the pattern are pre-computed and stored.

* * * * *